United States Patent [19]

Burt

[11] Patent Number: 4,940,510

[45] Date of Patent: Jul. 10, 1990

[54] METHOD OF ETCHING IN THE PRESENCE OF POSITIVE PHOTORESIST

[75] Inventor: Roy J. Burt, Sunnyvale, Calif.

[73] Assignee: Digital Equipment Corporation, Maynard, Mass.

[21] Appl. No.: 55,844

[22] Filed: Jun. 1, 1987

[51] Int. Cl.$^5$ ............................. C23F 1/00; B44C 1/22
[52] U.S. Cl. ..................................... 156/656; 156/654; 156/659.1; 156/664; 252/74.5
[58] Field of Search .................................. 252/79.1, 79.5; 156/654, 656, 659.1, 664, 667

[56] References Cited

U.S. PATENT DOCUMENTS

| | | | |
|---|---|---|---|
| 3,098,043 | 7/1963 | Wendell | 252/79.5 |
| 3,639,185 | 2/1972 | Colom et al. | 252/79.5 |
| 3,652,351 | 3/1972 | Guisti | 252/79.5 |
| 3,773,670 | 11/1973 | Colom et al. | 252/79.5 |
| 4,042,729 | 8/1977 | Polichette et al. | 252/79.5 |
| 4,294,651 | 10/1981 | Ohmura | 156/662 |
| 4,425,380 | 1/1984 | Nuzzi et al. | 156/655 |
| 4,430,154 | 2/1984 | Stahl et al. | 252/79.5 |
| 4,480,288 | 10/1984 | Gazdik et al. | 156/644 |
| 4,517,051 | 5/1985 | Gazdik et al. | 156/644 |
| 4,566,939 | 1/1986 | Miller et al. | 156/667 |
| 4,592,852 | 6/1986 | Corduvelis et al. | 252/79.5 |
| 4,601,783 | 7/1986 | Krulik | 252/79.5 |
| 4,601,784 | 7/1986 | Krulik | 252/79.5 |
| 4,629,636 | 12/1986 | Courdivelis et al. | 156/635 |
| 4,681,654 | 7/1987 | Clementi et al. | 156/633 |
| 4,698,124 | 10/1987 | Krulik | 252/79.5 |

FOREIGN PATENT DOCUMENTS

| | | | |
|---|---|---|---|
| 0038650 | 4/1975 | Japan | 252/79.5 |
| 1015975 | 2/1976 | Japan | 252/79.5 |

OTHER PUBLICATIONS

Vossen and Kern, *Thin Film Processes*, Academic Press, New York, N.Y., 1978, p. 408.

*Primary Examiner*—David L. Lacey
*Assistant Examiner*—Lori Johnson

[57] ABSTRACT

A wet chemical etchant for etching chromium films that have been patterned with positive photoresist comprising about 3 to about 9 grams potassium hydroxide per liter of water and about 15 to about 25 grams potassium permanganate per liter of water.

10 Claims, No Drawings

METHOD OF ETCHING IN THE PRESENCE OF POSITIVE PHOTORESIST

BACKGROUND OF THE INVENTION

This invention relates to a chemical etchant. In particular, this invention relates to a wet chemical etchant for chromium films that have been patterned with positive photoresist.

Alkaline chromium etchants have been used to etch chromium patterned with negative photoresist. The formulations for these etchants have relatively high concentrations of potassium hydroxide or sodium hydroxide. When used to etch chromium patterned with positive photoresist, this strong alkaline etchant will attack and dissolve the positive photoresist before the chromium film is completely etched away.

In formulating an alternative chromium etchant for use with positive photoresist, it was found that while acidic formulations did not attack positive photoresist, no acidic formulation would reliably depassivate oxidized chromium and etch the chromium metal while still maintaining a high selectivity to other metal layers, such as copper thin film.

SUMMARY OF THE INVENTION

The present invention overcomes the problems and disadvantages of the prior art by providing a wet chemical etchant for chromium that can be used in the presence of a positive photoresist.

The present invention also provides a wet chemical etchant useful for etching chromium films while still maintaining a high selectivity to copper films. This allows chromium surface oxides and chromium metal thin films to be etched and used in chromium/copper/chromium thin film multilayer structures without any significant etching or attack of the copper metal. Because the copper thin film is not attacked by the chromium etchant, undercutting of the patterned photoresist from copper etching during chromium etching is not a problem. This allows excellent control of linewidth during subtractive wet etching when positive photoresist is used.

Additional advantages of this invention are set forth in part in the following description. Other advantages will be obvious from the following description or may become apparent by practice of the invention. The appended claims particularly point out how the advantages of the invention can be obtained.

To achieve the advantages and in accordance with the purpose of the invention, as embodied and broadly described herein, the chromium etchant of this invention is for use with positive photoresist and comprises a solution of about 3 to about 9 grams of potassium hydroxide per liter of water and about 15 to about 25 grams of potassium permanganate per liter of water.

The present invention also provides a method for etching chromium in the presence of positive photoresist comprising contacting a chromium film which has been patterned with positive photoresist with a solution of about 3 to about 9 grams of potassium hydroxide per liter of water and about 15 to about 25 grams of potassium permanganate per liter of water.

Finally, the present invention provides a method for etching chromium in a chromium/copper thin film patterned with positive photoresist comprising contacting a chromium film with a solution of about 3 to about 9 grams of potassium hydroxide per liter of water and about 15 to about 25 grams of potassium permanganate per liter of water.

DETAILED DESCRIPTION OF THE INVENTION

In accordance with the invention, the method of chromium etching in the presence of positive photoresist is based on the use of a solution of water, potassium permanganate ($KMnO_4$), and potassium hydroxide (KOH). The present invention has found that about 3 to about 9 grams potassium hydroxide per liter of water and about 15 to about 25 grams potassium permanganate per liter of water will etch a chromium thin film patterned with positive photoresist without attacking the positive photoresist. Preferably, about 5 grams of potassium hydroxide and about 20 grams of potassium permanganate should be used.

As embodied herein, the etching is conducted at a temperature ranging from about 20 to about 50° C.

In the preferred embodiment, with about 5 grams per liter of potassium hydroxide and about 20 grams per liter potassium permanganate, the chromium etch rate at a temperature of about 21° C. is 50 angstroms per minute.

With potassium hydroxide concentrations substantially greater than about 9 grams per liter, the positive photoresist deteriorates, causing loss of pattern definition. With potassium hydroxide concentrations substantially less than about three grams per liter, the chromium etch rate is so slow as not to be practicable for a manufacturing process.

The formulation of this etchant is such that thin films of chromium less than 500 angstroms in thickness can be etched when using positive photoresist without any destructive attack of the photoresist.

I claim:

1. A method for etching chromium in the presence of positive photoresist comprising contacting a chromium film which has been patterned with positive photoresist with a solution consisting essentially of about 3 to about 9 grams potassium hydroxide per liter of water and about 15 to about 25 grams potassium permanganate per liter of water.

2. The method according to claim 1 where said solution consists essentially of about 5 grams of potassium hydroxide per liter of water and about 20 grams of potassium permanganate per liter of water.

3. The method according to claim 1 where said etching is conducted at a temperature ranging from about 20°C. to about 50°C.

4. The method according to claim 1 where said temperature is 21°C.

5. The method according to claim 1 where said chromium film has a thickness of less than about 500 angstroms.

6. A method for etching chromium in a chromium on copper thin film patterned with positive photoresist comprising contacting the chromium layer of said film with a solution consisting essentially of about 3 to about 9 grams potassium hydroxide per liter of water and about 15 to about 25 grams potassium permanganate per liter of water.

7. The method according to claim 6 where said solution consists essentially of about 5 grams of potassium hydroxide per liter of water and about 20 grams of potassium permanganate per liter of water.

8. The method according to claim 7 where said etching is at a temperature ranging from about 20° C. to about 50° C.

9. The method according to claim 8 where said temperature is 21° C.

10. The method according to claim 6 where said chromium film has a thickness of less than about 500 angstroms.

* * * * *

UNITED STATES PATENT AND TRADEMARK OFFICE
CERTIFICATE OF CORRECTION

PATENT NO. : 4,940,510

DATED : July 10, 1990

INVENTOR(S) : Roy J. Burt

It is certified that error appears in the above-identified patent and that said Letters Patent is hereby corrected as shown below:

Claim 4, column 2, line 53, change "claim 1" to --claim 3--.

Claim 8, column 3, line 1, change "claim 7" to --claim 6--.

Signed and Sealed this

Nineteenth Day of May, 1992

Attest:

DOUGLAS B. COMER

*Attesting Officer*  *Acting Commissioner of Patents and Trademarks*